(12) United States Patent
Win-Haw et al.

(10) Patent No.: US 6,957,692 B1
(45) Date of Patent: Oct. 25, 2005

(54) HEAT-DISSIPATING DEVICE

(75) Inventors: Chen Win-Haw, Taipei (TW); Lin Mao-Ching, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 10/929,497

(22) Filed: Aug. 31, 2004

(51) Int. Cl.[7] .......................................... F28D 15/00
(52) U.S. Cl. .......................... 165/104.33; 165/104.21; 361/700; 174/15.2; 257/715
(58) Field of Search ...................... 165/104.33, 104.86, 165/104.21, 185, 80.4; 361/700, 699; 857/714–716; 174/15.2

(56) References Cited

U.S. PATENT DOCUMENTS

| | | | |
|---|---|---|---|
| 5,308,920 A * | 5/1994 | Itoh | 174/15.2 |
| 5,694,295 A * | 12/1997 | Mochizuki et al. | 361/699 |
| 5,937,936 A * | 8/1999 | Furukawa et al. | 165/104.33 |
| 6,064,572 A * | 5/2000 | Remsburg | 361/700 |
| 6,158,502 A * | 12/2000 | Thomas | 165/104.26 |
| 6,382,309 B1 * | 5/2002 | Kroliczek et al. | 165/104.26 |
| 6,474,074 B2 * | 11/2002 | Ghoshal | 62/3.7 |
| 6,477,045 B1 * | 11/2002 | Wang | 361/700 |

* cited by examiner

*Primary Examiner*—Terrell McKinnon
(74) *Attorney, Agent, or Firm*—Bacon & Thomas, PLLC

(57) ABSTRACT

The present invention relates to aheat-dissipating device, which comprises an upper part and a lower part. The upper part further includes an inner joining face and an outer face opposite the inner joining face and the lower part further includes a concave surface which is engaged with the inner joining face of the upper part to form an air-tight chamber with a suitable quantity of circulating liquid being filled therein. The concave surface of the lower part further includes a plurality of capillary trenches and at least one basin, wherein each capillary trench connects the basin and further grid-like trenches are formed inside the basin in order to enhance vaporizing efficiency of the circulating liquid.

18 Claims, 4 Drawing Sheets

HEAT-DISSIPATING DEVICE

BACKGROUND OF THE INVENTION

1. Field of the Invention

The present invention relates to a kind of heat-dissipating device and, more particularly, to a heat-dissipating device which rapidly dissipates heat from a specified heat source within the central processunit (CPU) of a computer.

2. Description of Related Art

The higher the frequency of CPU, the faster the operation of computer, and it is more possible to satisfy the user's need. However, the higher the frequency of CPU, the more heat is generated during the computer's operation. If the heat can not be dissipated properly, it will result in a temperature rising, and the high temperature will cause the sensitivity of electronic elements of computer to be reduced, and even worse, the lifetime of those elements could be influenced. Therefore, how to promote the efficiency of heat-dissipating device in order to maintain ordinary computer operation becomes an important subject.

The heat-dissipating modes for heat-generating source such as CPU or other electronic elements can be roughly categorized into installing heat pipes, installing heat-dissipating fins, or further cooperating with a cooling fan in order to promote the heat-dissipating efficiency.

FIG. 1 shows a high speed thermally conductive device 100 having a liquid/vapor transformation. The high speed thermally conductive device 100 comprises an upper part 130 and a lower part 140, which are engaged together to form an air-tight chamber with an operating liquid (i.e. the circulating liquid of the present invention) being filled therein. The innerwall 150 of said air-tight camber has capillary structures 160. Said high speed thermally conductive device 100 achieves heat dissipation by cooperating with heat-dissipating fins 120 allocated on the outerface 170 of the upper part 130 and also with a cooling fan 110.

As the capillary structures 160 are evenly allocated, the operating liquid can not be guided to a specified heat-absorbing portion, even though the high speed thermally conductive device 100 cooperates with the process of liquid/vapor transformation, which enhances the heat-dissipating efficiency. Further, as the operating space of the liquid/vapor transformation had not been designed properly, the operating space above the heat-absorbing portion can not afford a suitable space for the liquid/vapor transformation.

SUMMARY OF THE INVENTION

According to problems of the conventional technology described above, the object of the present invention is to provide a heat-dissipating device, which has the best heat-dissipating effect on the major heat-generating source of computer, such as CPU.

To achieve the object mentioned above, the present invention discloses a heat-dissipating device, which is formed by engaging an upper part and a lower part tightly together. The joining face of the lower part has a concave surface equipped with radiant capillary trenches and with a basin in a relatively central portion thereof. Each capillary trench connects the basin, which absorbs the heat. The basin is disposed according to the location of the major heat-generating source of computer, with grid-like trenches being formed therein. An air-tight chamber is formed between the joining faces of the upper part and the lower part, with a suitable quantity of circulating liquid being filled therein.

As the basin is disposed according to the location of the major heat-generating source of computer, the circulating liquid can absorb heat of the heat-generating source more easily and directly therefrom. The heat-contact area of the circulating liquid is enlarged owing to the grid-like trenches, and thus the heat exchange efficiency is promoted. The circulating liquid absorbs heat by phase transformation from liquid to vapor, and the heat is carried by the vapor to a relatively far end with respect to the basin. When the vapor contacts the far end at relatively lower temperature, it condenses into liquid, with the heat being transferred to outer surfaces of the upper part and the lower part, and then the condensed liquid is guided back to the basin by the radiant capillary trenches to continue the liquid/vapor phase transformation of the circulating liquid. Thus, the heat-dissipating function of the heat-dissipating device of the present invention is achieved.

DETAILED DESCRIPTION OF THE REFERRED EMBODIMENTS

The detailed of the present invention or concrete practicable embodiments of the present invention will be described as follows, with reference to attached illustrations.

Figure 1:
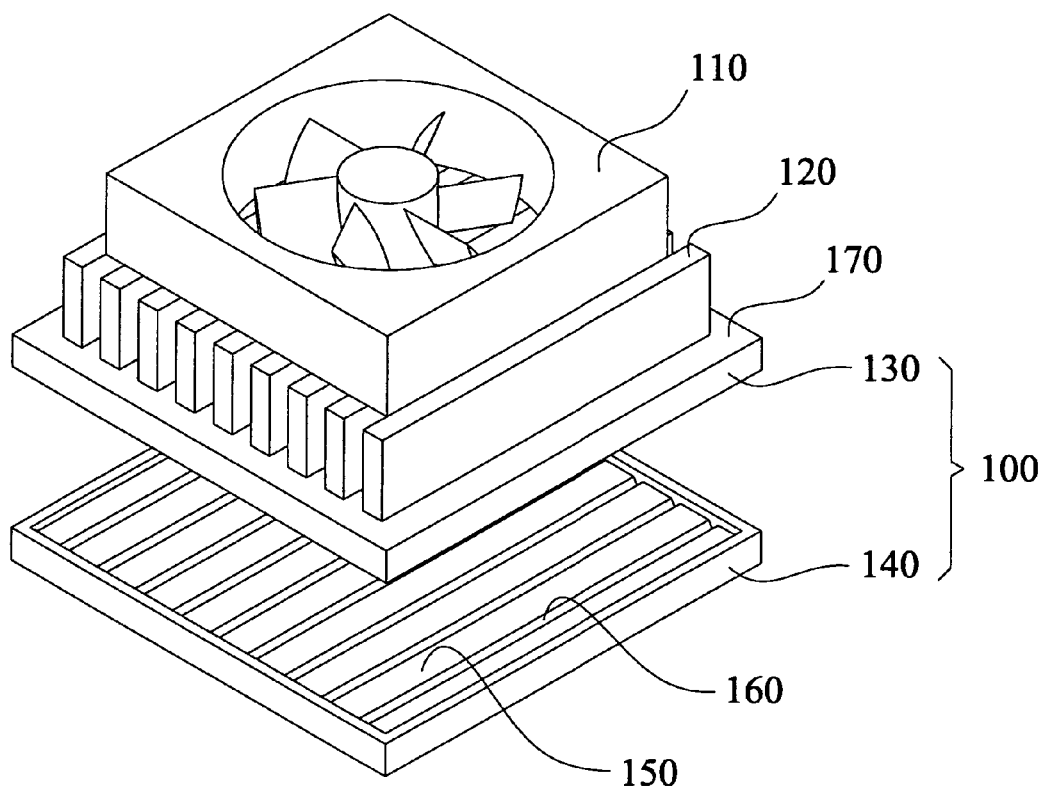
FIG. 1 is an exploded view illustrating the high speed thermally conductive device of the conventional technology.
Figure 2:
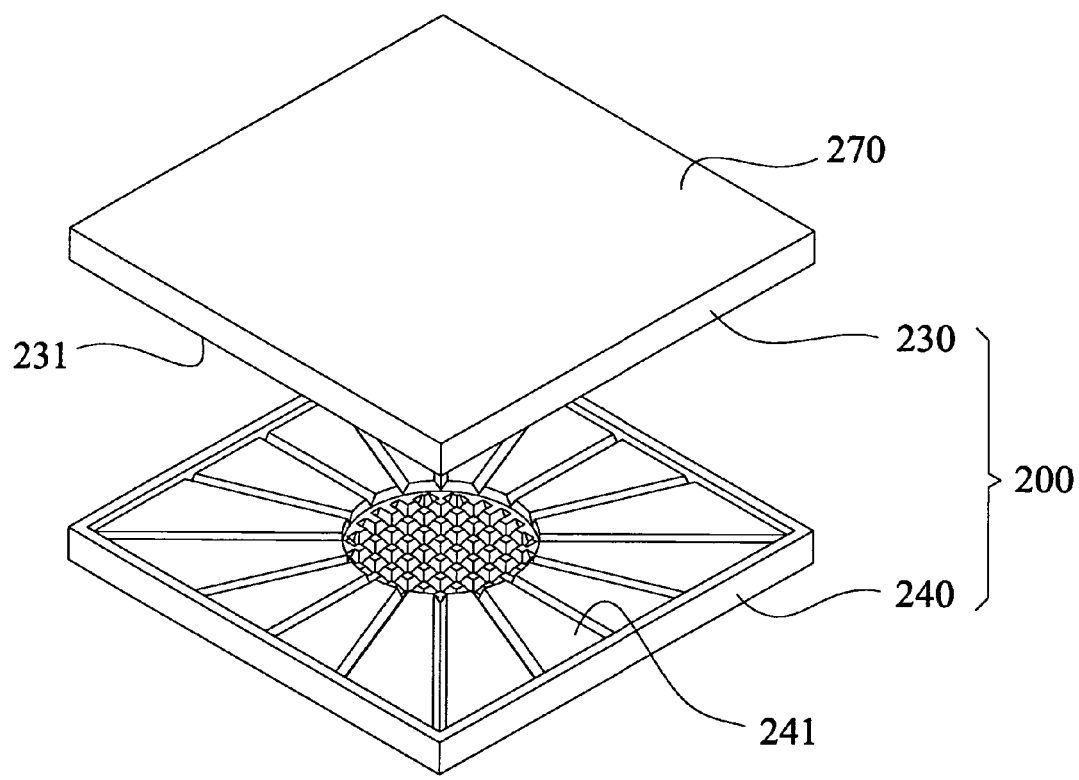
FIG. 2 is an exploded view illustrating the heat-dissipating device of the present invention.
Figure 3:
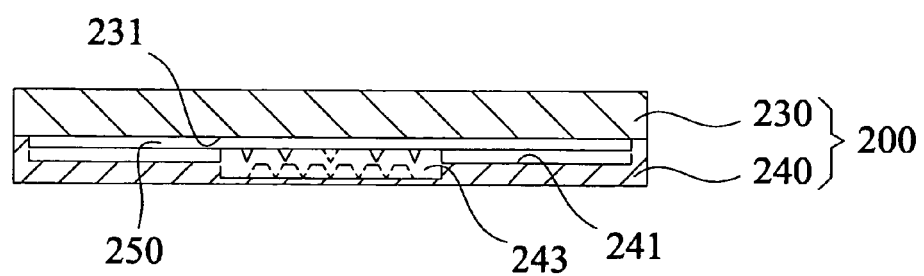
FIG. 3 is a structural illustration of the heat-dissipating device of the present invention.

FIG. 2 is an exploded view illustrating the heat-dissipating device of the present invention and FIG. 3 is a structural illustration of the heat-dissipating device of the present invention the aforementioned heat-dissipating device 200 is formed by engaging the joining face 231 of the upper part 230 and the concave surface 241 of the lower part 240 tightly together. The air-tight chamber 250 is formed between the upper part 230 and the lower part 240, with a suitable quantity of circulating liquid, such as pure water, methanol, methylbenzene, propyl alcohol, refrigerant and etc., being filled therein in order to utilize the process of liquid/vapor phase transformation to achieve the heat-dissipating function. Further, the heat-dissipating fins (not shown in the figure) can be installed on the outer face 270, which is opposite the joining face 231 of the upper part 230, in order to increase the heat-dissipating area thereof. Furthermore, a set of cooling fans(not shown in the figure) can be installed above the heat-dissipating fins to increase heat-dissipating efficiency by an enforced air cooling. The bodies of the upper part 230 and the lower part 240 of the heat-dissipating device 200 are made of thermally-conductive materials, such as copper, aluminum, magnesium, and any alloy of those, and fabricated as integral units by semisolid injection molding or die casting.

Figure 4:
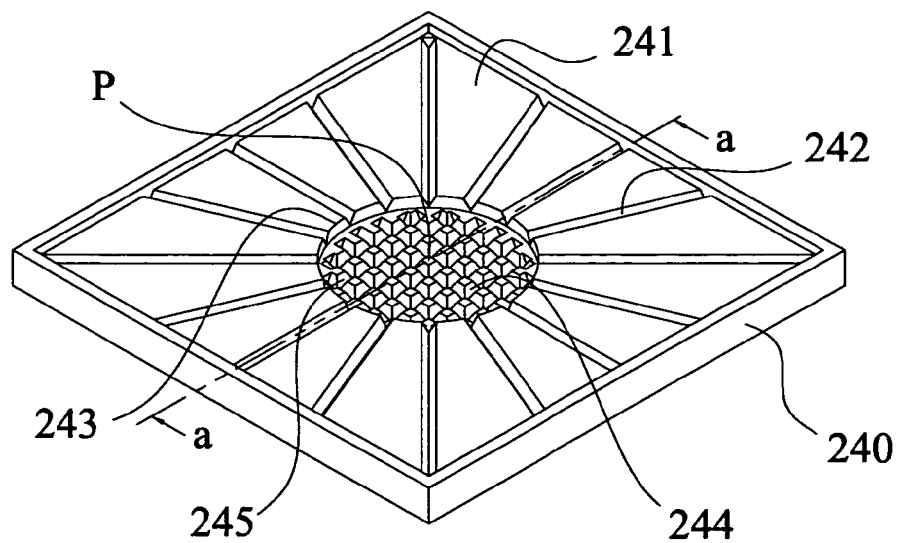
FIG. 4 is a partial view illustrating the detailed of the lower part of the heat-dissipating device of the present invention.
Figure 5:
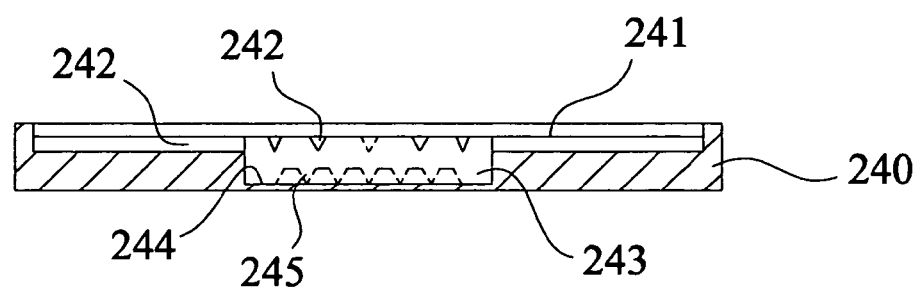
FIG. 5 is a cross-sectional view cut from the broken line a–a in FIG. 4, illustrating the lower part of the heat-dissipating device of the present invention.

As shown in FIG. 4, a partial view illustrating the detailed of the lower part of the heat-dissipating device of the present invention and FIG. 5 is a cross-sectional view cut from the broken line a–a in FIG. 4, the concave surface 241 of the lower part 240 has a plurality of capillary trenches 242, which are arranged in a radiant manners and intersect with each other at a relative center. The relatively central portion is the heat-absorbing portion(P) of the heat-dissipating device 200, which is disposed according to the major heat-generating source. Further, a suitable area of the basin 243 is formed on the heat-absorbing portion(P), according to heat-generating area of the major heat-generating source, and all the radiant capillary trenches 242 connect the basin 243. The primary function of the capillary trenches 242 is to provide capillarity for the circulating liquid, and the shape of cross section of those capillary trenches 242 can be designed to be any kind of shapes that can perform the capillarity, such as rectangle, trapezoid, triangle, or semi-circle.

Before the heat-generating source begin to generate heat, the circulating liquid inside the air-tight chamber 250 keeps at the ambient temperature and concentrates in the basin 243. As the heat-generating source begin to release heat, the heat will be conducted through the lower part 240 into the interior of the basin 243. The circulating liquid will absorb the heat from the inner wall 244 of the basin 243, and it will make the temperature of the circulating liquid rising to boiling. The boiling circulating liquid will produce vapor, which fulfills the basin 243, and the vapor will spread rapidly to the relatively far end with respect to the basin 243. As the relatively far end with respect to the basin 243 is also the relatively far end with respect to the heat-generating source, the temperature thereof is relatively lower. As the vapor reach there, it will condense into the liquid state. During the condensing process, the heat will be transferred to outside of the heat-dissipating device 200 therefrom, and then released to the air. Owing to the capillarity, the condensed circulating liquid will be guided through the capillary trenches 242 back to the basin 243. The liquid/vapor transformation of the circulating liquid, which concentrates in the basin 243, will be repeated again and again to maintain the heat-dissipating process.

When the major heat-generating source produces a relatively pretty large quantity of heat, it is necessary to increase the heat exchange area in order to achieve better heat-dissipating effect. It means increasing contact area between the circulating liquid and the inner wall 244 of the basin 243 according to the same principle in the heat-dissipating fins on the outer face 270 of the upper part 230. Therefore, the inner wall 244 is equipped with grid-like trenches 245, which are uniformly allocated over the inner wall 244 of the basin 243. The shapes of grid formed by the intersecting trenches are not intended to be limited, and those include rectangle, trapezoid, triangle, polygon, and honeycomb. Also, the shapes of the cross section of the trenches are not intended to be limited, and those include triangle, rectangle, and trapezoid.

Figure 6:
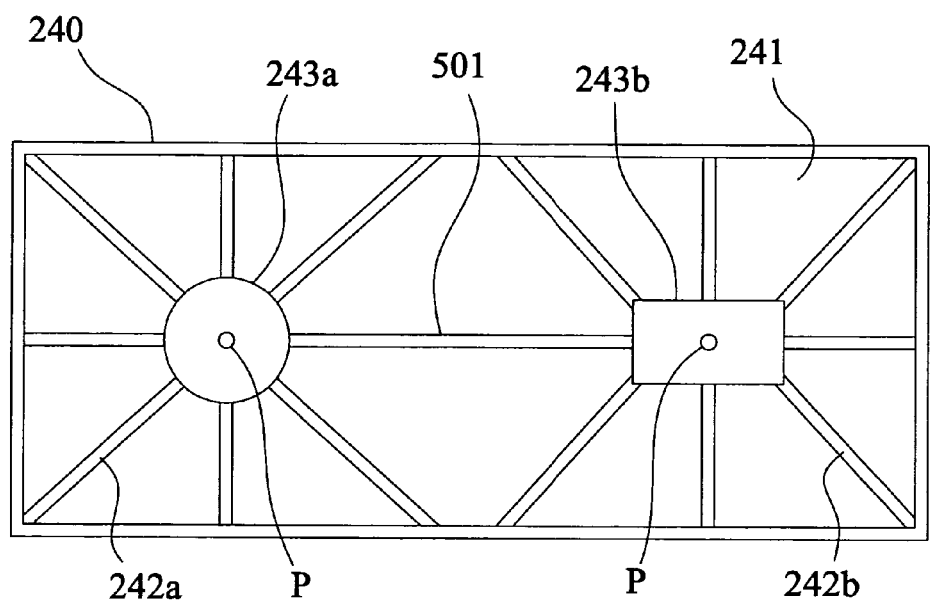
FIG. 6 is a partial view illustrating the detailed of the lower part of another embodiment of the present invention.

As shown in FIG. 6, a partial view illustrating the detailed of the lower part of another embodiment of the present invention the concave surface 241 of the lower part 240 has two basins—a basin 243a and a basin 243b, which are designed according to the shapes of different major heat-generating sources. The basin 243a is circular, and the basin 243b is rectangular, and further the best shape can be adopted according to different heat-generating sources. However, in order to let the circulating liquid can be flowed between the basin 243a and the basin 243b, there is a trench 501 for connecting. As there are two basins the basin 243a and the basin 243b, on the concave surface 241 of the lower part 240, two sets of radiant capillary trenches 242a and 242b are disposed relatively. By same principle, the inner walls of the basin 243a and the basin 243b are also equipped with the grid-like trenches (not shown in the figure) in order to increase heat exchange area to achieve the object of fast heat dissipation.

The advantage of present invention is that the concave surface 241 of the lower part 240 of the heat-dissipating device 200 has the basin 243 which is the heat-absorbing portion (P) of the heat-dissipating device 200 and is arranged according to the location and area of the major heat-generating source, with the inner wall 244 of the basin 243 being equipped with the grid-like trenches in order to increase heat exchange area between the circulating liquid and the inner wall 244.

It can be concluded that the present invention the heat-dissipating device 200 applying in the computer's heat-generating source will achieve the effect of fast heat-dissipation.

Accordingly, the present invention has an obvious improvement on the function in comparison with the conventional thermally conductive device 100.

Those described above are only the preferred embodiments of the present invention, and those are not intended to limit the scope of the present invention. It is to be understood by persons in the art that various different embodiments and variations of the present invention should not depart from the spirit or the scope of the present invention. The scope of the present is dependent on the appended claims, and all the modifications that are equivalent to or within the scope of the present inventions claims are to be included within the scope of the present inventior's claims.

What is claimed is:

1. A heat-dissipating device, comprising:
    an upper part, further including a joining face and an outer face opposite said joining face;
    a lower part, further including a concave surface which is engaged with said joining face of said upper part to form an air-tight chamber and has a plurality of capillary trenches and at least one basin, with each said capillary trench connecting said basin and with grid-like trenches being formed inside said basin; and
    a circulating liquid, enveloped in said air-tight chamber to perform the circulating progress of liquid/vapor phase transformation.

2. The heat-dissipating device according to claim 1, wherein said capillary trenches are arranged in radiant manners and connect said basin which is disposed in a relatively central position.

3. The heat-dissipating device according to claim 1, wherein said basin is disposed in a heat-absorbing portion of said heat-dissipating device.

4. The heat-dissipating device according to claim 3, wherein said heat-absorbing portion is disposed according to a heat-generating source.

5. The heat-dissipating device according to claim 1, wherein the shapes of said basin comprise circle and rectangle.

6. The heat-dissipating device according to claim 1, wherein the shapes of cross section of said capillary trenches include rectangle, trapezoid, triangle, and semi-circle.

7. The heat-dissipating device according to claim 1, wherein the shape of the grid of said grid-like trenches include rectangle, trapezoid, triangle, and honeycomb.

8. The heat-dissipating device according to claim 1, wherein said circulating liquids include volatile fluids.

9. The heat-dissipating device according to claim 8, wherein said volatile fluid include pure water, methanol, methylbenzene, propyl alcohol, and refrigerant.

10. The heat-dissipating device according to claim 1, wherein the materials of said upper part and said lower part include thermally conductive materials.

11. The heat-dissipating device according to claim 10, wherein said thermally conductive material include copper, aluminum, magnesium, and any alloy of those.

12. A heat-dissipating device, comprising:
   an upper part, further including a joining face and an outer face opposite said joining face;
   a lower part, further including a concave surface which is engaged with said joining face of said upper part to form an air-tight chamber and has a plurality of capillary trenches and at least two basins, with each said capillary trench connecting to at least one of said basins and with grid-like trenches being formed inside said basin; and
   a circulating liquid, enveloped in said air-tight chamber to perform the circulating progress of liquid/vapor phase transformation.

13. The heat-dissipating device of claim 12, wherein said capillary trenches are arranged in radiant manners.

14. The heat dissipating device of claim 12, wherein said basins are disposed in a heat-absorbing portion of said heat-dissipating device.

15. The heat dissipating device of claim 14, wherein said heat-absorbing portion is disposed according to a heat-generating source.

16. The heat dissipating device of claim 12, wherein the shapes of said basins comprise circles and rectangles.

17. The heat dissipating device of claim 12, wherein the shapes of cross section of said capillary trenches include rectangle, trapezoid, triangle, and semi-circle.

18. The heat dissipating device of claim 12, wherein the shape of the grid of said grid-like trenches include rectangle, trapezoid, triangle and honeycomb.

* * * * *